(12) United States Patent
Garza Leal

(10) Patent No.: US 10,264,692 B2
(45) Date of Patent: Apr. 16, 2019

(54) PROTECTIVE CASING FOR AN ELECTRICAL ENERGY READER INCLUDING A GLASS LENS

(71) Applicant: Jesus Garza Leal, Cadereyta Jimenez (MX)

(72) Inventor: Jesus Garza Leal, Cadereyta Jimenez (MX)

( * ) Notice: Subject to any disclaimer, the term of this patent is extended or adjusted under 35 U.S.C. 154(b) by 51 days.

(21) Appl. No.: 15/311,027

(22) PCT Filed: May 29, 2015

(86) PCT No.: PCT/MX2015/000082
§ 371 (c)(1),
(2) Date: Feb. 10, 2017

(87) PCT Pub. No.: WO2015/174816
PCT Pub. Date: Nov. 19, 2015

(65) Prior Publication Data
US 2017/0150627 A1    May 25, 2017

(30) Foreign Application Priority Data
May 12, 2014  (MX) ............... MX/u/2014/000201 U

(51) Int. Cl.
*B65D 25/54* (2006.01)
*H05K 5/03* (2006.01)
(Continued)

(52) U.S. Cl.
CPC ............... *H05K 5/03* (2013.01); *G01R 11/04* (2013.01); *G01R 21/00* (2013.01); *G01R 22/065* (2013.01)

(58) Field of Classification Search
CPC .................... H05K 5/03; G01R 21/00
(Continued)

(56) References Cited

U.S. PATENT DOCUMENTS 1,755,171 A * 4/1930 Bartenbach ............ G04B 37/10
                                                              368/286
2,029,769 A * 2/1936 Goldblatt ............. G04B 39/002
                                                              368/294
(Continued)

FOREIGN PATENT DOCUMENTS

CN     201083772 Y    7/2008
EP       0561714 A2   9/1993
(Continued)

OTHER PUBLICATIONS

International Search Report in related International patent application No. PCT/MX2015/000082, dated Oct. 13, 2015, 2 pages.

*Primary Examiner* — Shawn M Braden
(74) *Attorney, Agent, or Firm* — Law Office of Jeff Williams; J. Oliver Williams

(57) ABSTRACT

The present invention discloses a protective casing reader power polycarbonate where said casing is places crystal inserts in areas of reading and consumption data area, of said inserts meter feature a beveled periphery, whereby an adhesion to the glass with glue, the crystal inserts are integrated by plastic injection to allow a simple and clear reading, also has a front peripheral ring in which gives a greater resistance to shock, for which has a plastic casing with crystal reading areas which gives the advantage that even though is plastic it will opaque it will opaque due to the sun rays, the reading area will always be visible.

3 Claims, 3 Drawing Sheets

(51) Int. Cl.
*G01R 11/04* (2006.01)
*G01R 21/00* (2006.01)
*G01R 22/06* (2006.01)

(58) Field of Classification Search
USPC .......................................................... 220/664
See application file for complete search history.

(56) References Cited

U.S. PATENT DOCUMENTS

| | | | | |
|---|---|---|---|---|
| 2,222,911 | A * | 11/1940 | Morf | G04B 39/025 220/664 |
| 2,259,910 | A * | 10/1941 | Rylsky | G01D 11/28 220/664 |
| 2,505,121 | A * | 4/1950 | Knights | H03H 9/02157 29/25.35 |
| 2,647,404 | A * | 8/1953 | Whitworth | G01F 15/07 220/664 |
| 4,473,305 | A * | 9/1984 | Gogniat | G04B 39/00 368/291 |
| 4,582,220 | A * | 4/1986 | Batting | G01F 15/14 220/241 |
| 4,740,935 | A * | 4/1988 | Gogniat | A44C 27/00 368/292 |
| 6,074,246 | A * | 6/2000 | Seefeldt | H02B 1/03 220/664 |
| 6,406,178 | B1 * | 6/2002 | Luscher | G04B 37/0008 368/286 |
| 2004/0061490 | A1 * | 4/2004 | Huber | G01R 22/065 324/156 |
| 2006/0090342 | A1 * | 5/2006 | Tope | A44C 25/007 29/896.41 |
| 2011/0017196 | A1 * | 1/2011 | Bell | F24D 11/003 126/400 |
| 2017/0095189 | A1 * | 4/2017 | Ralston | A61B 5/157 |
| 2017/0150627 | A1 * | 5/2017 | Garza Leal | H05K 5/03 |
| 2017/0166130 | A1 * | 6/2017 | Foote | B60R 1/00 |

FOREIGN PATENT DOCUMENTS

| | | |
|---|---|---|
| FR | 21441212 A5 | 2/1973 |
| GB | 2082783 A | 3/1982 |

\* cited by examiner

PROTECTIVE CASING FOR AN ELECTRICAL ENERGY READER INCLUDING A GLASS LENS

OBJECT OF THE INVENTION

The objective of such invention is to provide a protective casing for equipment of electric meters which permits the user visual power of meter readings, in addition to resistance against shock and deterioration of the plastic due to the incidence of sunlight by combining the polycarbonate with the crystal.

BACKGROUND

The electric meters are known to have a protective casing which are fabricated of glass for which gives the resistance and visibility in the reading area of the meter, currently currently with the addition of plastic, and with the purpose of reducing cost and give the longer life and duration to the protective casing polycarbonate is being used, such material has more resistance against shock in the glass, but the inconvenience that is being exposed to the sun rays that deteriorates the polycarbonate in a short time turns to an opaque yellow, giving a visual contamination to read the consumed kilowatts, even though different chemicals or materials have been used to mitigate or reduce the dulling of the material, none have been effective since it's an element that constantly is exposed to the sun it becomes overshadow, therefore the present invention aims to solve the problem noted with a reading areas with greater visibility.

DETAILED DESCRIPTION OF THE INVENTION

Figure 1:
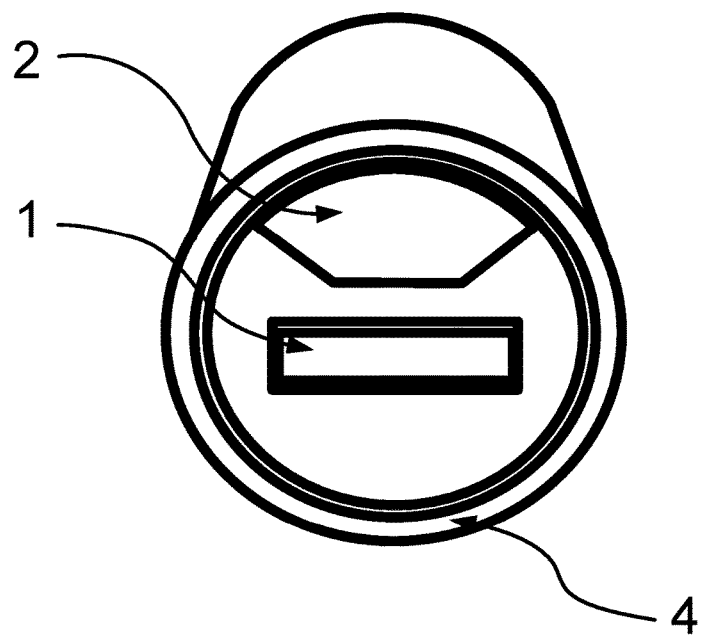
FIG. 1 shows the frontal isometric view of the protective casing in which is the area where the crystal inserts are appreciate it give the mayor visibility.
Figure 2:
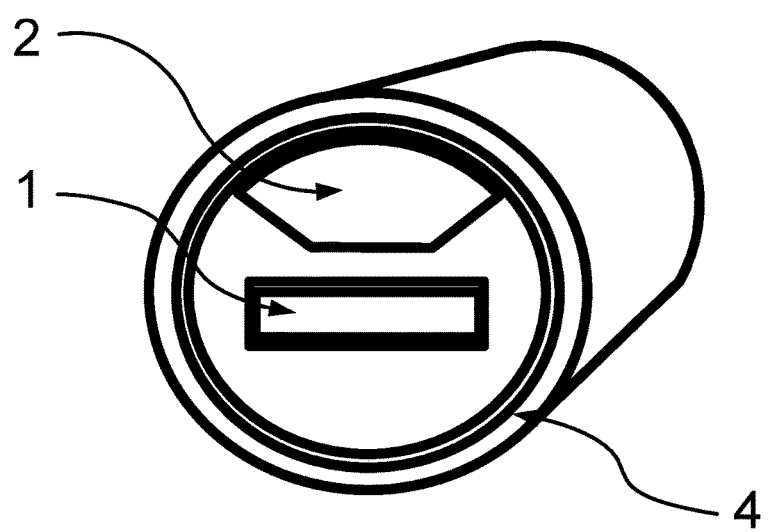
FIG. 2 is a perspective view and shows that only the front face carries said inserts and only the perimeter of said face carries an effort to make the casing more resistant.
Figure 3:
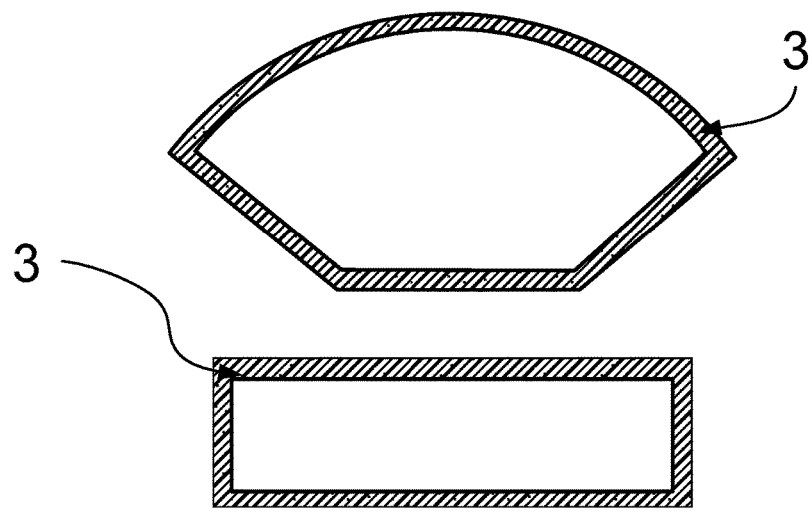
FIG. 3 is a view of the crystal inserts that combine with the polycarbonate or plastic either with glue on injectable plastic.
Figure 4:
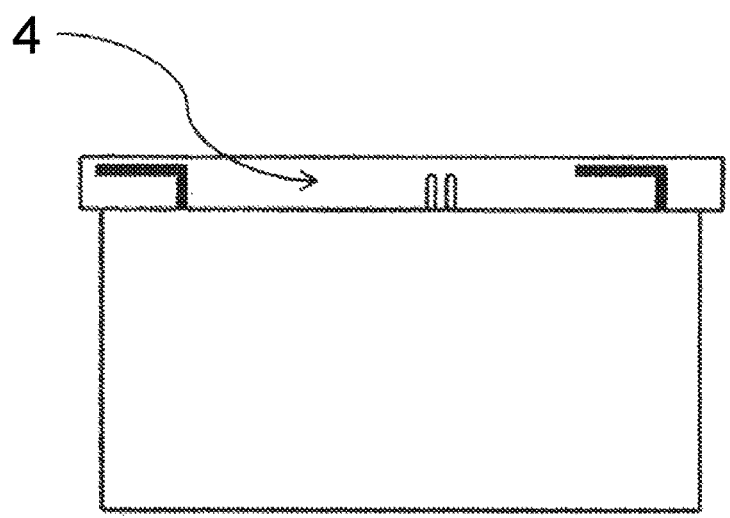
FIG. 4 is a superior view of the protective casing, where a frontal peripheral ring is Appreciate it that provides mayor resistance and protection against shock.
Figure 5:
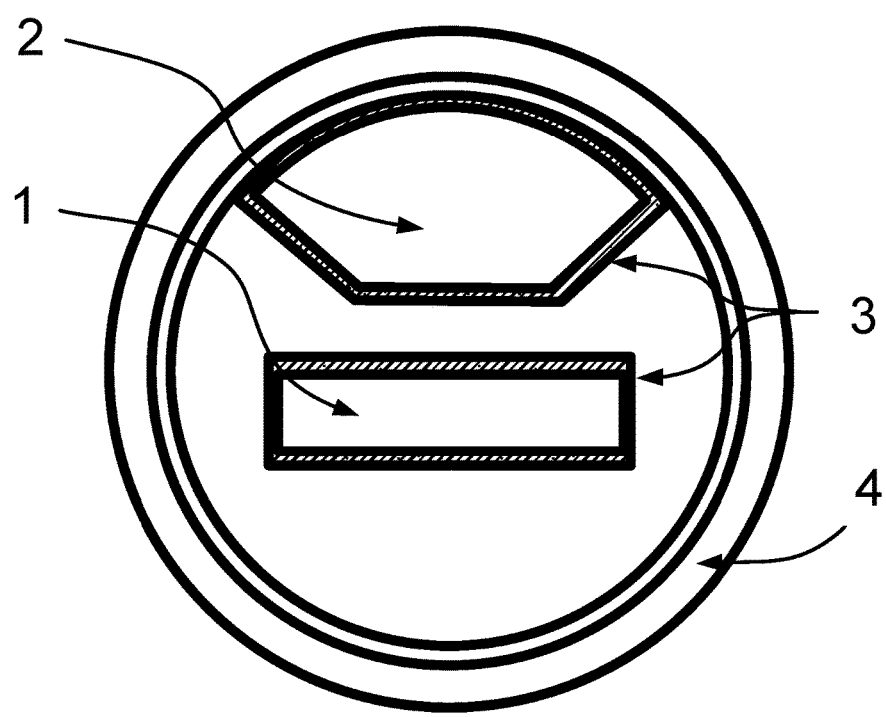
FIG. 5 is a front view of the protective casing of FIGS. 1 and 2.

Currently the electric meters installed by companies are principally all polycarbonate or combined with other plastics, with the purpose giving it more resistance to shock and deterioration that presents the crystal casing, besides the reduction of the cost of production, the principal inconvenience of the plastic material are constantly being exposed to the outdoors; such material in the long run it will present an opaque yellow coloration which prevents the reading of electrical consumption in the household where it is installed, for which such readings are wrong causing annoyance to users, therefore; it is proposed in the present invention an improved casing, which contains crystal inserts in the power (1) consumption area, and data (2) corresponding to the electric meter, to avoid visual contamination in the plastic protector of the same, giving the security to the user to confirm the electric consumption, and at the same time keep using the recycle plastic to the rest of the areas of the casing thereby give greater protection to the measurement equipment, since this polycarbonate material is highly resistant and with the crystal inserts will prolongs the life of the measurement; since the current system of the casing is perishable as it passes from the transparent to opaque and dark color by sunlight.

This crystal inserts have any geometric shape where for the area of consumption reading (1) will be preferably rectangular, and the area meter data (2) area will be preferably in the trapezoidal shape with semicircular surface, also such crystal inserts have a beveled (3) on the periphery, which allows said insert to be fixed to the polycarbonate or plastic to the remainder of the casing, such inserts will be fixed by any means of fastening preferably being adhesive material in a form or where appropriate to give durability by injection plastic, which provides greater strength since the crystal inserts are placed in the molds before injecting the molten plastic for which provides further integration of this two elements having a final product with a better design and finished, to give it longer resistance a periphery ring (4) is placed on the frontal face that provides mayor resistance against shock, the same will be integrated from the plastic injection.

The invention claimed is:

1. A polycarbonate plastic protective case with a front side for use with an electric meter, comprising:
   a polycarbonate body;
   a first crystal insert defining a meter reading area or meter display that forms a first glass window;
   a second crystal insert defining an electric meter identification data area that forms a second glass window; and
   a peripheral ring around the periphery of the polycarbonate body;
   wherein the first crystal insert and the second crystal insert have at least one of a geometric shape and an isometric shape and wherein each includes a beveled edge along its perimeter.

2. The case of claim 1, wherein the first and second crystal inserts are coupled to the polycarbonate body by an adhesive.

3. The case of claim 1, wherein the polycarbonate body is injection molded around a portion of the first and second crystal inserts.

* * * * *